United States Patent
Tseng et al.

(10) Patent No.: US 6,562,640 B1
(45) Date of Patent: May 13, 2003

(54) METHOD OF MANUFACTURING MICRO-DISPLAY

(75) Inventors: Ling-Yuan Tseng, Hsinchu (TW); Hao-Ming Cheng, Hsinchu (TW)

(73) Assignee: Taiwan Micro Display Corporation, Hsinchu (TW)

( * ) Notice: Subject to any disclaimer, the term of this patent is extended or adjusted under 35 U.S.C. 154(b) by 240 days.

(21) Appl. No.: 09/644,235

(22) Filed: Aug. 23, 2000

(51) Int. Cl.⁷ .................. H01L 21/66; G01R 31/26
(52) U.S. Cl. .................. 438/15; 438/14; 438/16; 438/17; 438/18; 349/73; 349/74; 349/113; 349/153; 349/155; 349/158
(58) Field of Search ............... 349/187, 73, 74, 349/113, 153, 155, 158; 438/15, 16, 17, 18

(56) References Cited

U.S. PATENT DOCUMENTS 6,005,649 A * 12/1999 Krusius et al. ............ 349/73
6,275,277 B1 * 8/2001 Walker et al. ............ 349/113

* cited by examiner

Primary Examiner—David Nelms
Assistant Examiner—Reneé R Berry
(74) Attorney, Agent, or Firm—Rosenberg, Klein & Lee

(57) ABSTRACT

A method of manufacturing micro-display includes the steps of testing individual chips on a base wafer forming the micro-display, and the tested "void" chips being marked, inputting the testing data into a sealant/glue machine and a laser puncher; sealant/glue forming on the external surrounding of a "passed" chip a sealant frame by the sealant/glue machine; forming an injection hole on an ITO glass panel at a position corresponding to the position of the "passed" chip, by means of the laser puncher; dispensing spacing particles within a chip's square box which has been formed with the sealant frame; position-aligning the ITO glass panel onto the wafer based on the wafer testing data; injecting a liquid crystal via the injection hole of the ITO glass panel located on the top layer of the "passed" chip to the space between the chips and the ITO glass; and sealing and dicing handling of the ITO glass panel to precisely manufacture the micro-display with a passed chip circuit so as to precisely screen the good products, and simplify the required number for fabrication and process.

9 Claims, 4 Drawing Sheets

METHOD OF MANUFACTURING MICRO-DISPLAY

BACKGROUND OF THE INVENTION (a) Technical Field of the Invention

The present invention relates to a method of manufacturing micro-display, and in particular to a method which is used to screen base chips, and simplify and eliminate the number of "void" chips in the fabrication process.

(b) Description of the Prior Art

Micro-displays are widely used in electrical projection devices, such as projectors, computer displays, projection TV, etc. The main action of the micro-displays is to produce original images of optical projection and by means of the reflection function between individual pixels of the reflection mirrors to proceed with "ON" and "OFF" control and with the combination of optical projection light source and the optical projection mechanism of the lenses combination, the original images can be enlarged and projected onto screen or displaying screen. Thus, the application of micro-display is very wide and the numbers of micro-displays used in computer and optical projection are now increasing. As a result, the quantity of production of micro-displays is an important factor in the manufacturing method.

However, in conventional manufacturing methods, the external surrounding of each base chip of the wafer is provided with a sealant frame, and to each of the square of the chip of the wafer, spacing particles are dispensed thereto. After that, the ITO glass panel indicating the top layer of the micro-display, corresponding to the square of the chip, is punched. The ITO glass panel is then mounted onto the wafer which has been provided with the sealant frame. Each of the square of the chip is then vacuumed, injecting a liquid crystal and sealed and cut to form a preliminary product of micro-display, but the product has to be electrically inspected and tested so as to check whether each chip circuit is functioning normally so as to screen the final micro-display product.

In the prior art method of manufacturing, the chips on the wafer, whether there are "passed" or void chips, are undergone sealing, dispensing of spacing particles, combination of ITO glass panel, vacuuming, injection of liquid crystal, sealing, dicing, and testing step. Thus, it is more costly and more material, labour force and time are involved. This will increase difficulties in the manufacturing process. Besides, the post testing of products causes an increase of production cost, and the rate of inferior products will be increased.

SUMMARY OF THE INVENTION

Accordingly, it is an object of the present invention to provide a method of manufacturing micro-display, wherein based on the tested data of the wafer to screen "passed" chips for fabrication, the material used, labour force and cost involved in the fabrication process are greatly reduced.

Yet another object of the present invention to provide a method of manufacturing micro-display, wherein electrical testing process of chips within the wafer is simplified so as to greatly lower labour force and cost for post-testing and inspection of the obtained products.

Another further object of the present invention to provide a method of manufacturing micro-display, wherein the production of inferior products containing high pollutant (such as liquid crystal) and waste are greatly reduced.

Yet another aspect of the present invention is to provide a method of manufacturing micro-display comprising the steps of testing individual chips on a base wafer forming the micro-display, and the tested "void" chips being marked, inputting the testing data into a sealant/glue machine and a laser puncher; sealant/glue forming on the external surrounding of an "passed" chip a sealant frame by the sealant/glue machine; forming an injection hole on an ITO glass panel at a position corresponding to the position of the "passed" chip, by means of the laser puncher; dispensing spacing particles within a chip's square box which has been formed with the sealant frame; position-aligning the ITO glass panel onto the wafer based on the wafer testing data; injecting a liquid crystal via the injection hole of the ITO glass panel located on the top layer of the "passed" chip to the space between the chips and the ITO glass; and sealing and dicing handling of the ITO glass panel to precisely manufacture the micro-display with a passed chip circuit so as to precisely screen the good products, and simplify the required number for fabrication and process.

DETAILED DESCRIPTION OF THE PREFERRED EMBODIMENT

Figure 1:
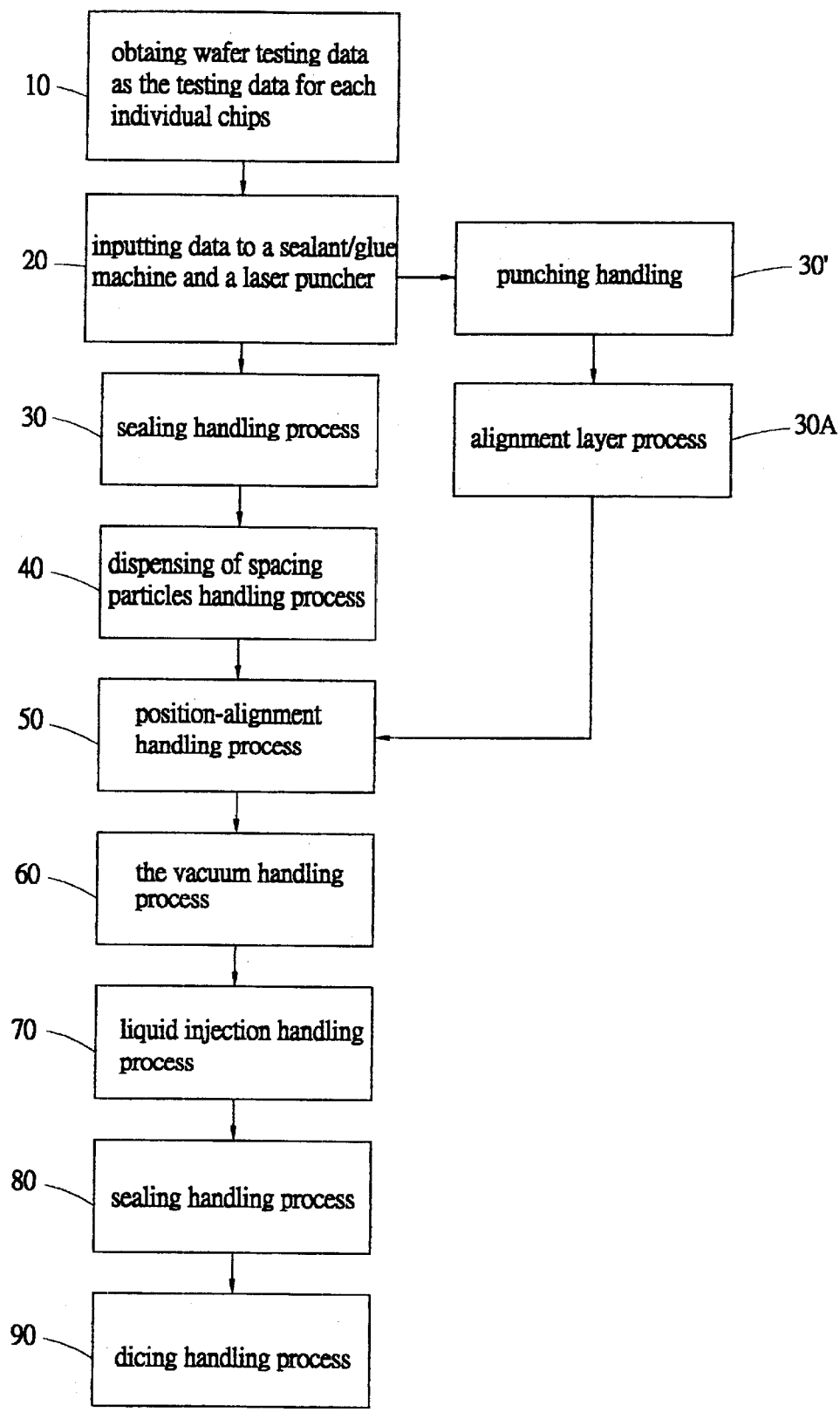
FIG. 1 is a flowchart of a method of manufacturing micro-display in accordance with the present invention.
Figure 2:
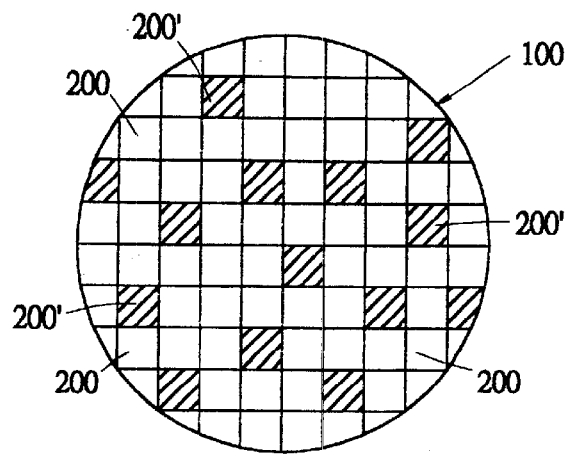
FIG. 2 is a schematic view showing the making of chips in accordance with the present invention.

First, referring to FIG. 1, there is shown a flow chart for the manufacturing of a micro-display in accordance with the present invention. Step 10 indicates the obtaining of wafer testing data as the testing data for each individual chips 200, 200' (as shown in FIG. 2) on the wafer 1 of the base circuit. The sources of data can be obtained from wafer manufacturers, chip-testing plant or by self-testing. The method of testing is carried out on a probe station (not shown), and the probing position is tested, either by a mobile testing head or by the method of moving the chips, and the X-axis and Y-axis coordinate data of the chips 200, 200' and the tested results will be respectively recorded by magnetic tapes, magnetic disc or other type of data-type recording. In the present invention, the size specification of the wafer 100 is 6 inches, 8 inches, or 12 inches. In accordance with a preferred embodiment, the chip 200 is tested as a "passed" chip which is so called good cell, and chip 200' is tested as a "void" chip. There is a mark on the surface of the chip 200' and the mark is printed with red ink.

Figure 3:
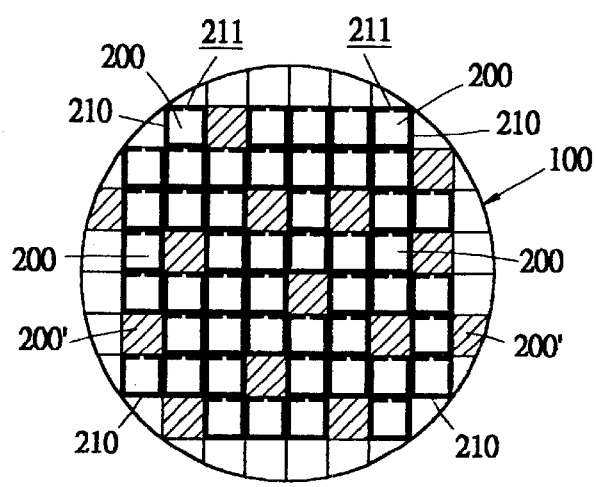
FIG. 3 is a schematic view showing the formation of a sealant frame around the "passed" chips within the wafer in accordance with the present invention.

Referring to FIG. 3, step 20 indicates the inputting of data to a sealant/glue machine and a laser puncher. That is, the above data of the wafer testing data is input to the sealant/glue machine and the laser puncher, and the sealant/glue machine and the laser puncher are controlled by a microcomputer and are provided with X-plane, and Y-plane coordinate automatic displacement control device. Thus, its position of displacement can be controlled based on the wafer testing data. FIG. 3 shows the sealing handling process of step 30, i.e. the surrounding of the selected "passed" chip 200 of the wafer 100 is proceeded to the sealing handling process by the sealing/glue machine such that the surrounding of each chip 200 is formed into a sealant frame 210. The material of the sealant is epoxy resin and is independent of thickness. Normally, the thickness is the height of the product, and the surrounding of the marked "void" chip 200' does not proceed to the sealant/glue process, and in the process of sealant/glue, one side edge of each sealant frame 210 is reserved with a notch 211 and the method of formation can be carried out by the size of range of chip's square box to set the distance of path taken by the sealant/glue machine.

Figure 4:
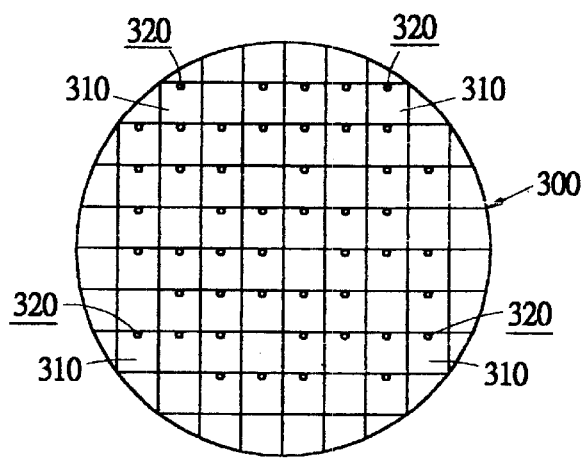
FIG. 4 is a schematic view showing the laser punching treatment on the ITO glass panel at a position corresponding to the "passed" chip in accordance with the present invention.

Referring to FIG. 4, simultaneous to step 30 (sealant/glue handling process), the laser puncher machine will at the same time execute step 30' (punching handling step). That is, the ITO glass panel 300 being the top layer, corresponding to one side edge of the square frame 310 of each individual chip 200 positioned on the wafer 100, the laser puncher is used to punch an injection hole 320 thereto. The position of the injection hole 320 is corresponding to the notch 211 at the sealant frame 210 surrounded the chip 200. The displacement position of the laser puncher is obtained based on the conversion of the wafer testing data after the data have been input. Thus, its position can be very precise, and the ITO glass panel 300 after the punching process has to proceed to the alignment layer process of step 30A. That is, by employing the method of sputtering or evaporating, the SiOx glass material is sputtered with a tilted angle onto the ITO glass panel 300.

Figure 5:
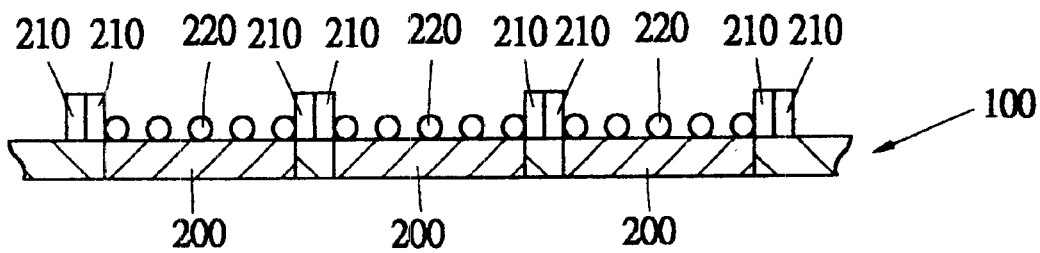
FIG. 5 is a sectional view showing the spacing particles within the chip's square box of the present invention.

Referring to FIG. 5, step 40 is a dispensing of spacing particles handling process. That is, glass beads 220 for spacing are dispensed randomly onto the square box of the chip 200 after it has been sealed, as shown in FIG. 5, the glass beads 220 are dispensed within the square box of the "passed" chip 200.

Figure 6:
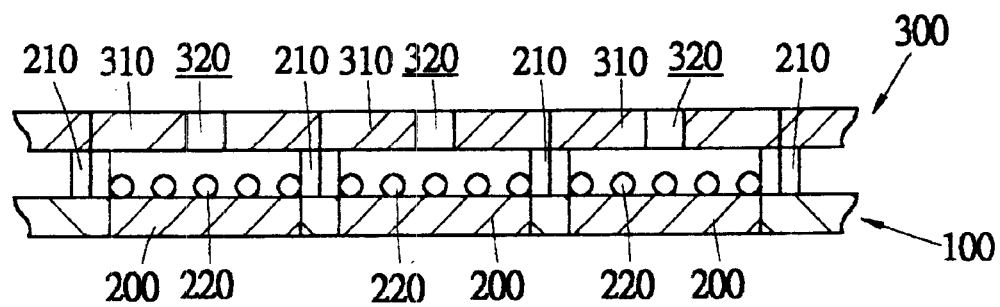
FIG. 6 is a sectional view showing the position-alignment mounting between the chip and the ITO glass panel of the present invention.

Referring to FIG. 6, there is shown the step 50 indicating the position-alignment handling process. That is, the ITO glass panel 300 which has been undergone step 30 is corresponding to the sealed wafer 100 such that the ITO glass panel 300 is pressed onto the wafer 100, and the square frame 310 having an injection hole 320 is respectively corresponding to each chip 200 of the wafer 100, and then by the method of UV radiation, the sealant frame 210 is caused to cure, and the wafer 100 and the ITO glass panel 300 are completely sealed.

Figure 7:
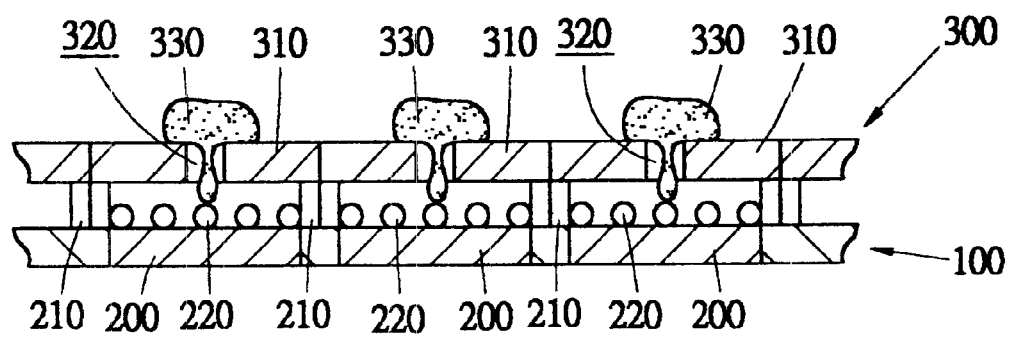
FIG. 7 is a sectional view showing the liquid crystal in between the chip and the ITO glass panel being injected into the injection hole of the ITO glass panel of the present invention.

Referring to FIG. 7, step 60 indicates the vacuum handling process. That is the position-alignment mounting of the combined ITO glass panel 300 with the wafer 100 is placed into a vacuum chamber, and is then proceeded to liquid injection handling process of step 70. After the ITO glass panel 300 and wafer 100 have been laminated together and forming the liquid crystal cavity, the liquid crystal dispenser will dispense a drop of liquid crystal 330 on top of the injection hole 320. The vacuum environment might be applied during the lamination process, or after the lamination process. It depends on the size of the vacuum chamber. That is, a liquid crystal dispenser is used to drop the liquid crystal 330 into the individual injection hole 320 of the ITO glass panel 300. At this instance, the vacuum is released to allow it to return to the atmospheric environment, and the liquid crystal 330 will gradually inject into the square box of the individual chip 200 via the injection hole 320, and after the liquid crystal 330 has been fully injected into the square box of the chip 220, it is proceeded to a sealing handling process of step 80. That is, by means of sealant/glue machine, the injection hole 320 of the ITO glass panel 300 and the notch 211 of the sealant frame 210 are sealed with sealant, and then cured by UV radiation.

After step 80 is completed, it is proceeded to dicing handling process of step 90. That is, by the top and bottom layer dicing method, laser cutter is used to cut the top layer of ITO glass panel 300, for the fact that the texture of the top and bottom layer is fragile. The bottom layer of the wafer 100 is cut using a scriber or a saw. The product of a micro-display 400 as shown in FIG. 8 is obtained.

Figure 8:
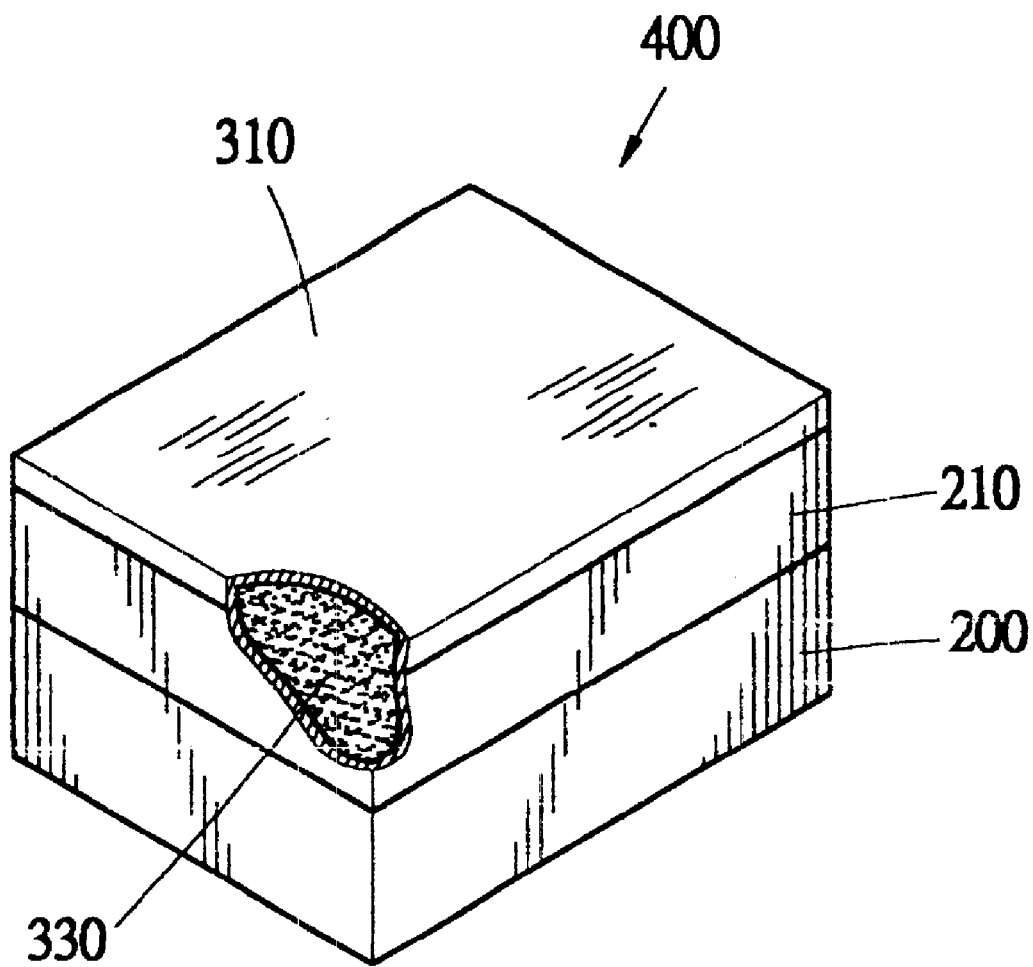
FIG. 8 is a perspective view of micro-display in accordance with the present invention.

Referring to FIG. 8, there is shown the micro-display 400 obtained via the steps 10–90. The entire process is effectively and discard the handing of the "void" chip 200', and time, labor and cost in the manufacturing process are thus saved. Besides, after the micro-display 400 is obtained and is tested subsequently, the complicated and laborious process of testing individual chips 200 are not needed. Therefore, the quality of product is improved and consistent. In addition, the obtained micro-display 400 will not produce waste material contained high pollutant (such as liquid crystal 300), and the drawback of inferior product is overcome.

While the invention has been described with respect to preferred embodiment, it will be clear to those skilled in the art that modifications and improvements may be made to the invention without departing from the spirit and scope of the invention. Therefore, the invention is not to be limited by the specific illustrative embodiment, but only by the scope of the appended claims.

What is claimed is:

1. A method of manufacturing micro-displays from a plurality of chips on a wafer, comprising the steps of:

(A) inputting testing data for the wafer to a sealant machine and a laser puncher, the testing data identifying locations of "passed" and "failed" chips on the wafer;

(B) forming a sealant frame surrounding a perimeter of the identified "passed" chips on the wafer with the sealant machine;

(C) punching injection holes through an ITO glass panel with the laser puncher, the injection holes being punched at locations corresponding to positions of the "passed" chips on the wafer as defined in the testing data;

(D) dispensing spacing particles within an enclosed area of each of the "passed" chips formed by the sealant frame;

(E) position-aligning the wafer with the ITO glass panel such that each injection hole in the ITO glass panel is located to correspond to a respective one of the "passed" chips;

(F) injecting liquid crystal into the enclosed area of each of the "passed" chips via the corresponding injection holes in the ITO glass panel;

(G) sealing the injection holes on the ITO glass panel with the sealant machine; and (H) dicing the wafer and ITO glass panel on the wafer and removing the identified "passed" chips.

2. The method of manufacturing micro-displays as set forth in claim 1, wherein both the sealant machine and the laser puncher are controlled by a micro-computer and possess X-axis and Y-axis coordinate displacement control.

3. The method of manufacturing micro-displays as set forth in claim 1, wherein the sealing material used in step (B) is epoxy resin.

4. The method of manufacturing micro-displays as set forth in claim 1, wherein the sealing process of step (B) includes the step of forming a notch in one side of the sealant frame for each "passed" chip corresponding to the injection holes of the ITO glass panel.

5. The method of manufacturing micro-displays as set forth in claim 1, wherein the punching process of step (C) includes the step of applying an alignment layer treatment to treat a surface of the ITO glass panel.

6. The method of manufacturing micro-displays as set forth in claim 5, wherein in the step of applying an alignment layer includes the step of sputtering a coating of a $SiO_x$ glass material at a tilted angle onto the ITO glass panel.

7. The method of manufacturing micro-displays as set forth in claim 5, wherein in the step of applying an alignment layer includes the step of evaporating a coating of a $SiO_x$ glass material at a tilted angle onto the ITO glass panel.

8. The method of manufacturing micro-displays as set forth in claim 1, wherein the liquid crystal injection of step (F) includes the step of injecting liquid crystal using a liquid crystal dispenser.

9. A method of manufacturing micro-displays from a plurality of chips on a wafer, comprising the steps of:

(A) obtaining wafer testing data for each of the individual chips on the wafer to respectively identify the chips as being "passed" and "void" chips based on the testing data;

(B) marking the "void" chips;

(C) inputting the testing data of the plurality of chips of the wafer to a sealant machine and a laser puncher, the testing data identifying locations of the "passed" and the "void chips;

(D) forming a sealant frame surrounding a perimeter of only the "passed" chips on the wafer with the sealant machine;

(E) punching injection holes through an ITO glass panel with the laser puncher, the injection holes being punched at locations corresponding to positions of the "passed" chips on the wafer as defined in the testing data;

(F) dispensing spacing particles within an enclosed area of each of the "passed" chips formed by the sealant frame;

(G) position-aligning the wafer with the ITO glass panel such that each injection hole in the ITO glass panel is located to correspond to a respective one of the "passed" chips;

(H) applying a vacuum environment to the wafer;

(I) injecting liquid crystal into the enclosed area of each of the "passed" chips via the corresponding injection holes in the ITO glass panel;

(J) releasing the vacuum environment and allowing the liquid crystal to inject into the enclosed areas of the individual chips via the corresponding injection holes;

(K) sealing the injection holes in the ITO glass panel the sealant machine; and (L) dicing the wafer and ITO glass panel on the wafer and removing the "passed" chips.

* * * * *